(12) United States Patent
Zhang

(10) Patent No.: US 11,670,349 B2
(45) Date of Patent: Jun. 6, 2023

(54) MEMORY CIRCUIT, MEMORY PRECHARGE CONTROL METHOD AND DEVICE

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 131 days.

(21) Appl. No.: 17/446,958

(22) Filed: Sep. 3, 2021

(65) Prior Publication Data
US 2022/0319559 A1 Oct. 6, 2022

Related U.S. Application Data

(63) Continuation of application No. PCT/CN2021/106688, filed on Jul. 16, 2021.

(30) Foreign Application Priority Data

Mar. 31, 2021 (CN) .......................... 202110352502.0

(51) Int. Cl.
*G11C 5/14* (2006.01)
*G11C 7/10* (2006.01)

(52) U.S. Cl.
CPC .............. *G11C 7/1048* (2013.01); *G11C 5/14* (2013.01); *G11C 7/109* (2013.01); *G11C 7/1063* (2013.01); *G11C 7/1069* (2013.01); *G11C 7/1096* (2013.01)

(58) Field of Classification Search
CPC ....... G11C 7/1048; G11C 5/14; G11C 7/1063; G11C 7/1069; G11C 7/109; G11C 7/1096; G11C 7/22; G11C 11/4076; G11C 11/4094; G11C 7/12
USPC .............................................. 365/189.05, 203
See application file for complete search history.

(56) References Cited

U.S. PATENT DOCUMENTS

| 5,245,579 | A | | 9/1993 | Ohta | |
| 5,815,451 | A | | 9/1998 | Tsuchida | |
| 5,831,924 | A | * | 11/1998 | Nitta | G11C 8/14 365/230.02 |

(Continued)

FOREIGN PATENT DOCUMENTS

| CN | 1497607 A | 5/2004 |
| CN | 101017703 A | 8/2007 |

(Continued)

*Primary Examiner* — Michael T Tran
(74) *Attorney, Agent, or Firm* — Syncoda LLC; Feng Ma

(57) ABSTRACT

A memory circuit includes a precharge circuit and control circuit. The precharge circuit comprises a first precharge circuit, second precharge circuit, first power supply end, second power supply end, first control end, second control end and data end. The first precharge circuit is connected with the first power supply end, first control end and data end. The second precharge circuit is connected with the second power supply end, second control end and data end. A first precharge voltage is input into the first power supply end, and a second precharge voltage is input into the second power supply end. The control circuit is configured to control connection and disconnection between the data end and second power supply end and to control connection and disconnection between the data end and first power supply end.

17 Claims, 3 Drawing Sheets

(56) References Cited

U.S. PATENT DOCUMENTS

| | | | |
|---|---|---|---|
| 2004/0066700 A1 | 4/2004 | Lee | |
| 2006/0133168 A1* | 6/2006 | Kwack | G11C 11/406 365/230.03 |
| 2007/0189096 A1 | 8/2007 | Lee | |
| 2007/0201295 A1* | 8/2007 | Lines | G11C 7/06 365/230.03 |
| 2009/0185440 A1 | 7/2009 | Lee | |
| 2012/0008446 A1 | 1/2012 | Kim | |
| 2012/0243354 A1* | 9/2012 | Loh | G11C 29/52 365/201 |
| 2013/0044551 A1* | 2/2013 | Kuroda | G11C 11/1653 365/189.11 |
| 2015/0036419 A1* | 2/2015 | Ishii | G11C 11/419 365/154 |
| 2015/0155016 A1* | 6/2015 | Ku | G11C 7/02 365/189.011 |
| 2016/0148693 A1* | 5/2016 | Lee | G11C 11/5628 365/185.11 |
| 2017/0213586 A1* | 7/2017 | Kang | G06F 3/0673 |
| 2019/0341103 A1* | 11/2019 | Campardo | G11C 13/0004 |
| 2019/0355408 A1* | 11/2019 | Shin | G11C 11/4094 |
| 2020/0013451 A1 | 1/2020 | Son | |
| 2020/0027497 A1* | 1/2020 | Shin | G06F 3/0659 |

FOREIGN PATENT DOCUMENTS

| | | | | |
|---|---|---|---|---|
| CN | 101788963 A | | 7/2010 | |
| CN | 105895148 A | | 8/2016 | |
| CN | 108573732 A | * | 9/2018 | G06F 11/10 |
| CN | 110675904 A | | 1/2020 | |
| CN | 111902871 A | | 11/2020 | |

* cited by examiner

MEMORY CIRCUIT, MEMORY PRECHARGE CONTROL METHOD AND DEVICE

CROSS-REFERENCE TO RELATED APPLICATIONS

The application is a continuation of International Patent Application No. PCT/CN2021/106688 filed in Jul. 16, 2021, which claims priority to Chinese Patent Application No. 202110352502.0 filed on Mar. 31, 2021. The disclosures of these applications are hereby incorporated by reference in their entirety.

BACKGROUND

A Dynamic Random-Access Memory (DRAM) is a volatile memory, which usually includes a plurality of read circuits for reading information in an arrayed storage unit. Each read/write operation often needs to be completed in one time cycle. A data line needs to be precharged to a preset voltage during operation of a memory, that is, precharge operation is performed.

SUMMARY

The present disclosure relates generally to the technical field of integrated circuits, and more specifically to a memory circuit, a method for controlling precharge of a memory and a computer device.

The present disclosure provides a memory circuit, which may include a precharge circuit and a control circuit. The precharge circuit may include a first precharge circuit, a second precharge circuit, a first power supply end, a second power supply end, a first control end, a second control end and a data end; the first precharge circuit is connected with the first power supply end, the first control end and the data end; the second precharge circuit is connected with the second power supply end, the second control end and the data end; and a first precharge voltage is input into the first power supply end, and a second precharge voltage is input into the second power supply end. The first output end of the control circuit is connected with the first control end, and the second output end of the control circuit is connected with the second control end. The control circuit is configured to: perform control to make the data end and the second power supply end to be connected with each other through the second precharge circuit and perform control to make the data end and the first power supply end to be disconnected from each other through the first precharge circuit when a memory is not in a row active state; perform control to make the data end and the second power supply end to be disconnected from each other through the second precharge circuit and perform control to make the data end and the first power supply end to be disconnected from each other through the first precharge circuit when the memory is in the row active state and does not perform read/write operation; perform control to make the data end and the second power supply end to be disconnected from each other through the second precharge circuit and perform control to make the data end and the first power supply end to be connected with each other through the first precharge circuit when the memory is in the row active state and during a preset time after a first read/write operation is started; perform control to make the data end and the second power supply end to be disconnected from each other through the second precharge circuit and perform control to make the data end and the first power supply end to be disconnected from each other through the first precharge circuit when the memory is in the row active state and after a preset time after the first read/write operation is started; perform control to make the data end and the second power supply end to be disconnected from each other through the second precharge circuit and perform control to make the data end and the first power supply end to be disconnected from each other through the first precharge circuit when the memory is in the row active state and during a preset time after the first read/write operation is completed; and perform control to make the data end and the second power supply end to be disconnected from each other through the second precharge circuit and perform control to make the data end and the first power supply end to be connected with each other through the first precharge circuit when the memory is in the row active state and after a preset time after the first read/write operation is completed.

The present disclosure further provides a method for controlling precharge of a memory, applied to the precharge circuit of the memory. The precharge circuit may include a first precharge circuit, a second precharge circuit, a first power supply end, a second power supply end, a first control end, a second control end and a data end; the first precharge circuit is connected with the first power supply end, the first control end and the data end; the second precharge circuit is connected with the second power supply end, the second control end and the data end; and a first precharge voltage is input into the first power supply end, and a second precharge voltage is input into the second power supply end. The method may include the following operations. The data end and the second power supply end are controlled to be connected with each other through the second precharge circuit and the data end and the first power supply end are controlled to be disconnected from each other through the first precharge circuit when the memory is not in a row active state. The data end and the second power supply end are controlled to be disconnected from each other through the second precharge circuit and the data end and the first power supply end are controlled to be disconnected from each other through the first precharge circuit when the memory is in the row active state and does not perform read/write operation. The data end and the second power supply end are controlled to be disconnected from each other through the second precharge circuit and the data end and the first power supply end are controlled to be connected with each other through the first precharge circuit when the memory is in the row active state and during a preset time after the first read/write operation is started. The data end and the second power supply end are controlled to be disconnected from each other through the second precharge circuit and the data end and the first power supply end are controlled to be disconnected from each other through the first precharge circuit when the memory is in the row active state and after a preset time after the first read/write operation is started. The data end and the second power supply end are controlled to be disconnected from each other through the second precharge circuit and the data end and the first power supply end are controlled to be disconnected from each other through the first precharge circuit when the memory is in the row active state and during a preset time after the first read/write operation is completed. The data end and the second power supply end are controlled to be disconnected from each other through the second precharge circuit and the data end and the first power supply end are controlled to be connected with each other through the first precharge circuit when the memory is in the row active state and after a preset time after the first read/write operation is completed.

The present disclosure further provides a computer device, including a memory and a processor. The memory stores a computer program. When the processor executes the computer program, the steps of the control method in any of the above embodiments are realized.

BRIEF DESCRIPTION OF THE DRAWINGS

In order to describe the technical solutions in the embodiments of the present disclosure or a conventional art more clearly, the drawings required to be used in descriptions about the embodiments or the conventional art will be simply introduced below. It is apparent that the drawings described below are only some embodiments of the present disclosure. Other drawings may further be obtained by those of ordinary skilled in the art according to these drawings without creative work.

SPECIFICATION OF THE REFERENCE SIGNS IN THE DRAWINGS

Figure 1:
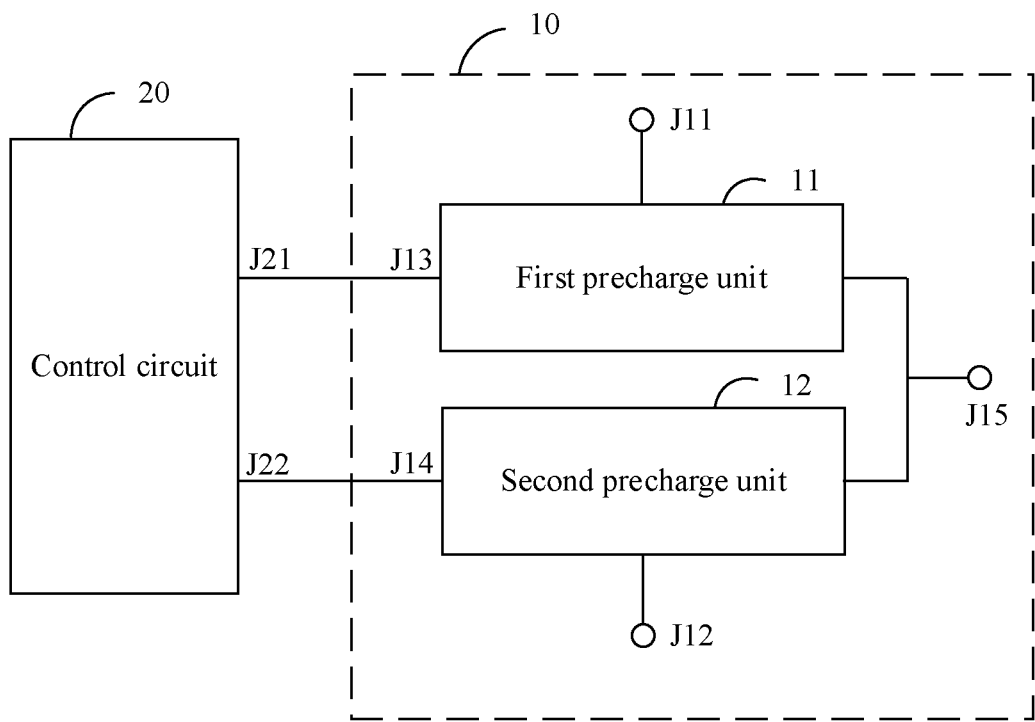
FIG. 1 is a structural block diagram of a memory circuit according to an embodiment.

10: Precharge circuit; 11: First precharge unit; 111: First switch unit; 112: Second switch unit; 12: Second precharge unit; 121: Third switch unit; 122: Fourth switch unit; 20: Control circuit; 21: First inverting unit; 22, Time delay unit; 23: Second inverting unit; 24: Latch unit; 25: Three input NOR gate; 26: Third inverting unit; and 27: Inverter.

DETAILED DESCRIPTION

In order to make the present disclosure convenient to understand, the present disclosure will be described more comprehensively below with reference to the related drawings. The drawings show preferred embodiments of the present disclosure. However, the present disclosure may be implemented in various forms and is not limited to the embodiments described herein. Instead, these embodiments are provided to make the contents disclosed in the present disclosure understood more thoroughly and comprehensively.

Unless otherwise defined, all technical and scientific terms used herein have the same meanings as commonly understood by those skilled in the art that the present disclosure belongs to. Herein, terms used in the description of the present disclosure are only for the purpose of describing specific embodiments and not intended to limit the present disclosure.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, regions, layers, doping types and/or parts may be described with terms first, second, third, etc., these elements, components, regions, layers, doping types and/or parts should not be limited to these terms. These terms are used only to distinguish one element, component, region, layer, doping type or part from another element, component, region, layer, doping type or part. Therefore, a first element, component, region, layer, doping type or part discussed below may be represented as a second element, component, region, layer or part without departing from the teaching of the present disclosure. For example, a first precharge unit may be called as a second precharge unit, similarly, the second precharge unit may be called as a first precharge unit, and the first precharge unit and the second precharge unit are different precharge units.

Spatially relational terms such as "below", "under", "lower", "beneath", "above", and "upper" may be used herein for describing a relationship between one element or feature and another element or feature illustrated in the figures. It is to be understood that, in addition to the orientation shown in the figures, the spatially relational terms further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. Moreover, the device may include otherwise orientation (such as rotation by 90 degrees or in other orientations) and the spatial descriptors used herein may be interpreted accordingly.

As used herein, singular forms "a/an", "one", and "the" may include the plural forms, unless otherwise specified types in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. Meanwhile, as used herein, term "and/or" includes any and all combinations of the related listed items.

Each time a conventional memory device enters a row active state, a preset voltage is input into a data line in a memory array, and therefore, preparation is made for subsequent read/write operation. Therefore, active current IDD0 may be increased, and this portion of current is wasted if no subsequent read/write operation is performed in the row active state, resulting in large memory power consumption.

FIG. 1 is a structural block diagram of a memory circuit according to an embodiment. As shown in FIG. 1, a memory circuit may include a precharge circuit 10 and a control circuit 20. The precharge circuit 10 may include a first precharge unit 11, a second precharge unit 12, a first power supply end J11, a second power supply end J12, a first control end J13, a second control end J14 and a data end J15. The first precharge unit 11 is connected with the first power supply end J11, the first control end J13 and the data end J15, and the first control end J13 is a control end of the first precharge unit 11. The second precharge unit 12 is connected with the second power supply end J12, the second control end J14 and the data end J15, and the second control end J14 is a control end of the second precharge unit 12. First precharge voltage is input to the first power supply end J11, and second precharge voltage is input to the second power supply end J12.

A first output end J21 of the control circuit 20 is connected with the first control end J13, the control circuit 20 controls the first precharge unit 11 to work by controlling signals of the first output end J21 of the control circuit 20, specifically, the first power supply end J11 and the data end J15 are controlled to be connected by the first precharge unit 11, so that the first precharge voltage is input to the data end J15, or the first power supply end J11 and the data end J15 are controlled to be disconnected by the first precharge unit 11, so that the input of the first precharge voltage to the data end J15 is stopped; and a second output end J22 of the control circuit 20 is connected with the second control end J14, the control circuit 20 controls the second precharge unit 12 to work by controlling signals of the second output end J22 of the control circuit 20, specifically, the second power supply end J12 and the data end J15 are controlled to be connected with each other through the second precharge unit 12, so that the second precharge voltage is input to the data end J15, or the second power supply end J12 and the data end J15 are controlled to be disconnected from each other through the second precharge unit 12, and thus input of the second precharge voltage to the data end J15 is stopped. The first precharge voltage and the second precharge voltage may be set according to actual requirements and may be set to be unequal. The data end J15 may be connected to a data line in the memory, so that the precharge of the data line may be controlled through the memory circuit. The data line in the embodiment may be a Local Input Output (LIO, which may also be referred to as local input output line) line in the memory.

Specifically, the control circuit 20 is configured to:

perform control to make the data end J15 and the second power supply end J12 to be connected with each other through the second precharge unit 12 and perform control to make the data end J15 and the first power supply end J11 to be disconnected from each other through the first precharge unit 11 when the memory is not in a row active state;

perform control to make the data end J15 and the second power supply end J12 to be disconnected from each other through the second precharge unit 12 and perform control to make the data end J15 and the first power supply end J11 to be disconnected from each other through the first precharge unit 11 when the memory is in the row active state and does not perform read/write operation;

perform control to make the data end J15 and the second power supply end J12 to be disconnected from each other through the second precharge unit 12 and perform control to make the data end J15 and the first power supply end J11 to be connected with each other through the first precharge unit 11 when the memory is in the row active state and during a preset time after the first read/write operation is started;

perform control to make the data end J15 and the second power supply end J12 to be disconnected from each other through the second precharge unit 12 and perform control to make the data end J15 and the first power supply end J11 to be disconnected from each other through the first precharge unit 11 when the memory is in the row active state and after a preset time after the first read/write operation is started;

perform control to make the data end J15 and the second power supply end J12 to be disconnected from each other through the second precharge unit 12 and perform control to make the data end J15 and the first power supply end J11 to be disconnected from each other through the first precharge unit 11 when the memory is in the row active state and during a preset time after the first read/write operation is completed; and perform control to make the data end J15 and the second power supply end J12 to be disconnected from each other through the second precharge unit 12 and perform control to make the data end J15 and the first power supply end J11 to be connected with each other through the first precharge unit 11 when the memory is in the row active state and during a preset time after the first read/write operation is completed.

In some examples, the control circuit 20 may have a first input end (not shown in FIG. 1) and a second input end (not shown in FIG. 1). The first input end of the control circuit 20 may be connected with a row active signal line of the memory so as to obtain a row active signal of the memory, and the control circuit 20 may determine whether the memory is in a row active state or not according to the row active signal of the memory. The second input end of the control circuit 20 may be connected with a read/write signal line of the memory so as to obtain a read/write signal of the memory, and the control circuit 20 may determine whether the memory starts read/write operation or not according to the read/write signal of the memory.

In other examples, the control circuit 20 may determine whether the memory is in a row active state or not and begins the read/write operation or not in other ways as well.

Figure 2:
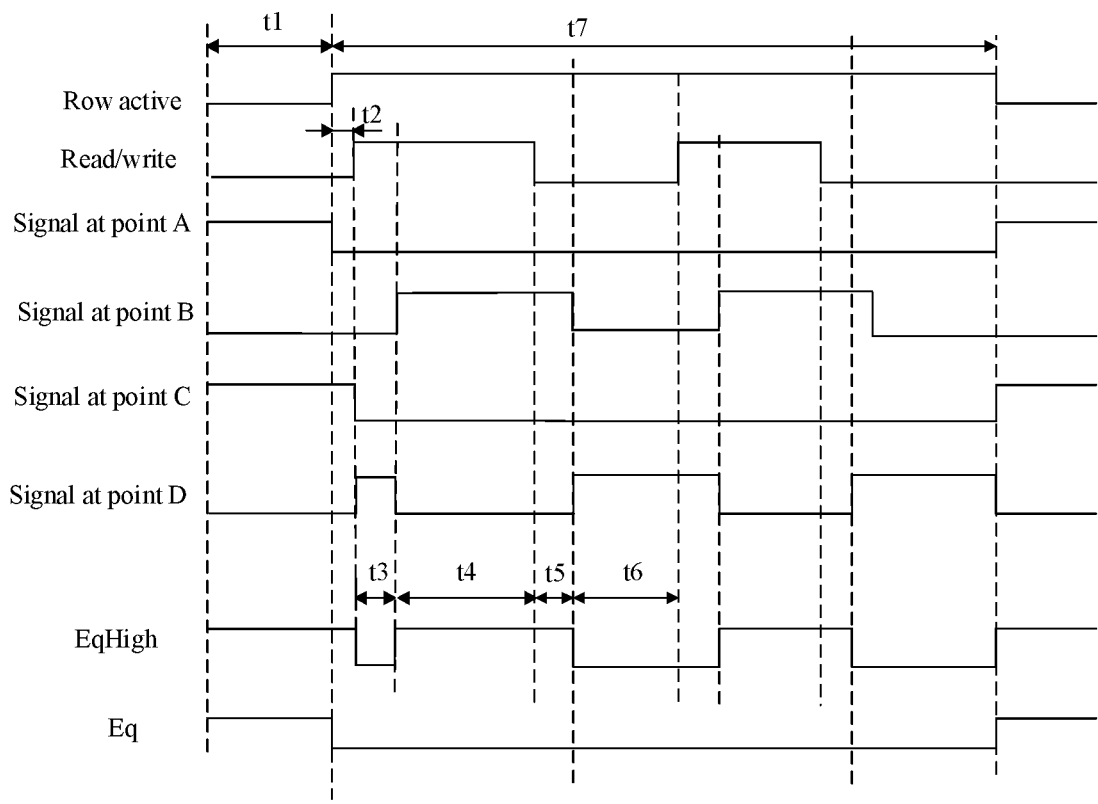
FIG. 2 is a waveform graph of various signals in a memory circuit according to an embodiment.

In some examples, when the control circuit 20 judges whether the memory is in a row active state or not according to the row active signal of the memory and judges whether the memory starts the read/write operation or not according to the read/write signal of the memory, referring to FIGS. 1 and 2, the memory is in the row active state when the row active signal Row active is at a high level, and the memory is not in the row active state when the row active signal Row active is at a low level; and when the read/write signal Read/Write is at the high level, the memory performs the read/write operation, and when the read/write signal Read/Write is at the low level, the memory does not perform the read/write operation. The control circuit 20 controls a first control signal EqHigh output to the first control end J13 (the control end of the first precharge unit 11) of the precharge circuit 10 according to the row active signal Row active, and the first precharge unit 11 controls whether the first power supply end J11 and the data end J15 are connected or not according to the first control signal EqHigh, so that whether the first precharge voltage is input to the data end J15 or not is controlled. The control circuit 20 controls a second control signal Eq output to the second control end J14 (the control end of the second precharge unit 12) of the precharge circuit 10 according to the read/write signal Read/Write, and the second precharge unit 12 controls whether the second power supply end J12 and the data end J15 are connected or not according to the second control signal Eq, so that whether the second precharge voltage is input to the data end J15 or not is controlled.

For a time period t1, the row active signal Row active is at a low level, and the memory is not in a row active state. The control circuit 20 controls a second control signal Eq output by a second output end J22 of the control circuit 20 to be at a high level, and the control end of the second precharge unit 12 controls the second power supply end J12 and the data end J15 to be connected after receiving the high level; the control circuit 20 also controls a first control signal EqHigh output by a first output end J21 of the control circuit 20 to be at a high level, and the control end of the first precharge unit 11 controls the first power supply end J11 and the data end J15 to be disconnected after receiving the high level; and therefore, when the memory is not in the row active state, the memory circuit inputs the second precharge voltage to the data line through the data end J15.

For a time period t2, the row active signal Row active is at a high level, and the memory is in a row active state; and the read/write signal Read/Write is at a low level, and the memory does not perform the read/write operation. The control circuit 20 controls a second control signal Eq output by the second output end J22 of the control circuit 20 to be at a low level, and the control end of the second precharge unit 12 controls the second power supply end J12 and the data end J15 to be disconnected after receiving the low level; the control circuit 20 also controls a first control signal EqHigh output by the first output end J21 of the control circuit 20 to be at a high level, and the control end of the first precharge unit 11 controls the first power supply end J11 and the data end J15 to be disconnected after receiving the high level; and therefore, when the memory is in the row active state and does not carry out read/write operation, the memory circuit does not input first precharge voltage to the data line through the data end J15 and does not input the second precharge voltage to the data line through the data end J15, and at the time, even though the memory is already in the row active state, but the read/write signal Read/Write signal is at a low level, and the memory does not perform the read/write operation, so that precharge operation is not performed.

For a time period t3 after the first read/write operation is started, the row active signal Row active is at a high level, and the memory is in a row active state; and the read/write signal Read/Write is at a high level, and the memory performs the read/write operation. The control circuit 20 controls a second control signal Eq output by the second output end J22 of the control circuit 20 to be at a low level, and the control end of the second precharge unit 12 controls the second power supply end J12 and the data end J15 to be disconnected after receiving the low level; the control circuit 20 also controls a first control signal EqHigh output by the first output end J21 of the control circuit 20 to be at a low level, and the control end of the first precharge unit 11 controls the first power supply end J11 and the data end J15 to be connected after receiving the low level; and therefore, when the memory is in the row active state, and within time period t3 after the first read/write operation is started, the memory circuit inputs the first precharge voltage to the data line through the data end J15, and a preparation is made for subsequent data read/write.

For a time period t4, the row active signal Row active is at a high level, and the memory is in a row active state; furthermore, the read/write signal Read/Write signal is at a high level, after a preset time t3 after the first read/write operation is started (when rising edges of the read/write signal Read/Write arrive, the memory starts to perform the read/write operation) till the first read/write operation is ended (when falling edges of the read/write signal Read/Write arrive, the memory starts to stop the read/write operation). The control circuit 20 controls a second control signal Eq output by the second output end J22 of the control circuit 20 to be at a low level, and the control end of the second precharge unit 12 controls the second power supply end J12 and the data end J15 to be disconnected after receiving the low level; the control circuit 20 also controls a first control signal EqHigh output by the first output end J21 of the control circuit 20 to be at a high level, and the control end of the first precharge unit 11 controls the first power supply end J11 and the data end J15 to be disconnected after receiving the high level; and therefore, when the memory is in the row active state and after the preset time t3 after the first read/write operation is started, till the first read/write operation is ended, the memory circuit does not input the first precharge voltage to the data line through the data end J15 and does not input the second precharge voltage to the data line through the data end J15. At the moment, a storage array is preforming data read/write, during read operation, the voltage on the data line is determined by data (0 or 1) stored in a storage unit; and during write operation, the voltage on the data line is determined by externally written data.

For a time period t5 after the first read/write operation is completed, the row active signal Row active is at a high level, and the memory is in a row active state; and the read/write signal Read/Write is at a low level, and the memory does not perform the read/write operation. The control circuit 20 controls a second control signal Eq output by the second output end J22 of the control circuit 20 to be at a low level, and the control end of the second precharge unit 12 controls the second power supply end J12 and the data end J15 to be disconnected after receiving the low level; the control circuit 20 also controls a first control signal EqHigh output by the first output end J21 of the control circuit 20 to be at a high level, and the control end of the first precharge unit 11 controls the first power supply end J11 and the data end J15 to be disconnected after receiving the high level; and therefore, when the memory is in the row active state and during the preset time t3 after the first read/write operation is completed, the memory circuit does not input the first precharge voltage to the data line through the data end J15 and does not input the second precharge voltage to the data line through the data end J15.

For a time period t6, the row active signal Row active is at a high level, the memory is in a row active state; furthermore, the read/write signal Read/Write is at a low level, after a preset time t5 after the first read/write operation is completed, the control circuit 20 controls a second control signal Eq output by the second output end J22 of the control circuit 20 to be at a low level, and the control end of the second precharge unit 12 controls the second power supply end J12 and the data end J15 to be disconnected after receiving the low level; the control circuit 20 also controls a first control signal EqHigh output by the first output end J21 of the control circuit 20 to be at a low level, and the control end of the first precharge unit 11 controls the first power supply end J11 and the data end J15 to be connected after receiving the low level; and therefore, when the memory is in the row active state, and after the preset time t5 after the first read/write operation is completed, the memory circuit inputs the first precharge voltage to the data line through the data end J15. The second read/write operation is started after the time period t6 is ended.

In other embodiments, the arrangement may also be as below.

The memory is not in a row active state when the row active signal Row active is at a high level, and the control circuit 20 controls the first control signal EqHigh output by the first output end J21 of the control circuit 20 to be at a high level; and the control circuit 20 also controls the second control signal Eq output by the second output end J22 of the control circuit 20 to be at a high level.

The memory is in a row active state when the row active signal Row active is at a low level, the memory does not perform read/write operation when the read/write signal Read/Write is at a high level, and the control circuit 20 controls the first control signal EqHigh output by the first output end J21 of the control circuit 20 to be at a high level;

and the control circuit 20 also controls the second control signal Eq output by the second output end J22 of the control circuit 20 to be at a low level.

The memory is in a row active state when the row active signal Row active is at a low level, and the memory performs the first read/write operation when the read/write signal Read/Write is at a low level, during a preset time after the first read/write operation is started, the control circuit 20 controls the first control signal EqHigh output by the first output end J21 of the control circuit 20 to be at a low level; and the control circuit 20 also controls the second control signal Eq output by the second output end J22 of the control circuit 20 to be at a low level.

The memory is in a row active state when the row active signal Row active is at a low level, and the memory performs the first read/write operation when the read/write signal Read/Write is at a low level, after a preset time after the first read/write operation is started, the control circuit 20 controls the first control signal EqHigh output by the first output end J21 of the control circuit 20 to be at a high level; and the control circuit 20 also controls the second control signal Eq output by the second output end J22 of the control circuit 20 to be at a low level.

The memory is in a row active state when the row active signal Row active is at a low level, when the read/write signal Read/Write is at a high level, during a preset time after the first read/write operation of the memory is completed, the control circuit 20 controls the first control signal EqHigh output by the first output end J21 of the control circuit 20 to be at a high level; and the control circuit 20 also controls the second control signal Eq output by the second output end J22 of the control circuit 20 to be at a low level.

The memory is in a row active state when the row active signal Row active is at a low level, when the read/write signal Read/Write is at a high level, after a preset time after the first read/write operation of the memory is completed, the control circuit 20 controls the first control signal EqHigh output by the first output end J21 of the control circuit 20 to be at a low level; and the control circuit 20 also controls the second control signal Eq output by the second output end J22 of the control circuit 20 to be at a low level.

In yet another embodiment, the arrangement may also be as below.

The memory is not in a row active state when the row active signal Row active is at a low level, the control circuit 20 controls the first control signal EqHigh output by the first output end J21 of the control circuit 20 to be at a low level, and the control circuit 20 further controls the second control signal Eq output by the second output end J21 of the control circuit 20 to be at a low level.

The memory is in a row active state when the row active signal Row active is at a high level, the memory does not perform read/write operation when the read/write signal Read/Write is at a low level, and the control circuit 20 controls the first control signal EqHigh output by the first output end J21 of the control circuit 20 to be at a low level; and the control circuit 20 also controls the second control signal Eq output by the second output end J22 of the control circuit 20 to be at a high level.

The memory is in a row active state when the row active signal Row active is at a high level, and the memory performs the first read/write operation when the read/write signal Read/Write is at a high level, during a preset time after the first read/write operation is started, the control circuit 20 controls the first control signal EqHigh output by the first output end J21 of the control circuit 20 to be at a high level; and the control circuit 20 also controls the second control signal Eq output by the second output end J22 of the control circuit 20 to be at a high level.

The memory is in a row active state when the row active signal Row active is at a high level, and the memory performs the first read/write operation when the read/write signal Read/Write is at a high level, after a preset time after the first read/write operation is started, the control circuit 20 controls the first control signal EqHigh output by the first output end J21 of the control circuit 20 to be at a low level; and the control circuit 20 also controls the second control signal Eq output by the second output end J22 of the control circuit 20 to be at a high level.

The memory is in a row active state when the row active signal Row active is at a high level, when the read/write signal Read/Write is at a low level, during a preset time after the first read/write operation of the memory is completed, the control circuit 20 controls the first control signal EqHigh output by the first output end J21 of the control circuit 20 to be at a low level; and the control circuit 20 also controls the second control signal Eq output by the second output end J22 of the control circuit 20 to be at a high level.

The memory is in a row active state when the row active signal Row active is at a high level, when the read/write signal Read/Write is at a low level, after a preset time after the first read/write operation of the memory is completed, the control circuit 20 controls the first control signal EqHigh output by the first output end J21 of the control circuit 20 to be at a high level; and the control circuit 20 also controls the second control signal Eq output by the second output end J22 of the control circuit 20 to be at a high level.

In other examples, the row active signal Row active with the row active state of the memory, the read/write signal Read/Write with the read/write state of the memory, the control relationship between the input end and the output end of the control circuit 20, and the control relationship of the precharge circuit 10 may be in other ways, and are not repeated one by one here.

According to the memory circuit, the data end J15 and the second power supply end J12 are controlled to be disconnected from each other through the second precharge unit 12 and the data end J15 and the first power supply end J11 are controlled to be disconnected from each other through the first precharge unit 11 when the memory is in the row active state and does not perform read/write operation, at the moment, the first charge voltage is not input to the data end J15, the second charge voltage is not input to the data end J15, so that the data line is not precharged, and therefore, current waste when the memory is in the row active state and does not perform read/write operation may be avoided. Meanwhile, after the preset time after the first read/write operation is completed, the memory circuit inputs the first precharge voltage to the data line through the data end J15, preparation is made for subsequent read/write operation, so that the memory does not need to be precharged separately at a preset time in the subsequent read/write operation cycle, which improves the read/write speed of the memory.

In some examples, the first precharge voltage is a supply voltage VCCA of the memory, and the second precharge voltage is a half of the supply voltage of the memory, namely, ½VCCA. In other examples, the magnitude of the first precharge voltage and the second precharge voltage may also be set according to actual needs.

In some examples, the memory performs multiple read/write operations in one cycle of the row active state. In one cycle of the row active state of the memory, after a preset time after each read/write operation is completed each time, the control circuit 20 controls the data end J15 and the first power supply end J11 to be connected with each other through the first precharge unit 11, the memory circuit inputs the first precharge voltage to the data line through the data end J15 to prepare for subsequent read/write operations and improve the read/write speed of the memory; after the preset time after the next read/write operation is started, the first precharge unit 11 controls the data end J15 and the first power supply end J11 to be disconnected, and at this time, the storage array is reading and writing data.

Merely by way of example, and still referring to FIG. 2, within one cycle t7 of the row active state of the memory, a plurality of high levels occur on the read/write signal Read/Write, namely, plurality of times of read/write is performed. When a first rising edge of the read/write signal Read/Write arrives, first read/write starts, and the first control signal EqHigh output by the first output end J21 of the control circuit 20 jumps to a low level, and jumps to a high level after the low level is maintained for a preset time t3. Until the preset time after the first read/write operation is completed, the first control signal EqHigh output by the first output end J21 of the control circuit 20 jumps to the low level again, and jumps to a high level after the low level is maintained after a preset time after the next read/write operation is started. And so on until the memory is not in the row active state. At the end of one cycle of the row active state of the memory, the row active signal Row active jumps from high level to low level, while the read/write signal Read/Write remains at low level, the point A signal jumps from low level to high level, the point B signal remains at low level, the point C signal jumps from low level to high level, and the point D signal jumps from high level to low level, the first control signal EqHigh jumps from a low level to a high level, and the second control signal Eq jumps from a low level to a high level.

In the embodiment, when the first control signal EqHigh is at a low level, the first precharge circuit 10 controls the first power supply end J11 and the data end J15 to be connected, and the first power supply end J11 inputs the first precharge voltage to the data end J15; and when the first control signal EqHigh is at a high level, the first precharge circuit 10 controls the first power supply end J11 and the data end J15 to be disconnected, and the first power supply end J11 stops inputting the first precharge voltage to the data end J15.

In some examples, the first input end J23 of the control circuit 20 inputs the row active signal Row active, and the second input end J24 of the control circuit 20 inputs the read/write signal Read/Write. When the row active signal Row active is at a low level, the memory is not in a row active state; and when the row active signal Row active is at a high level, the memory is in the row active state. When the read/write signal Read/Write is at a low level, the memory does not perform the read/write operation; and when the read/write signal Read/Write is at a high level, the memory performs the read/write operation.

Figure 3:
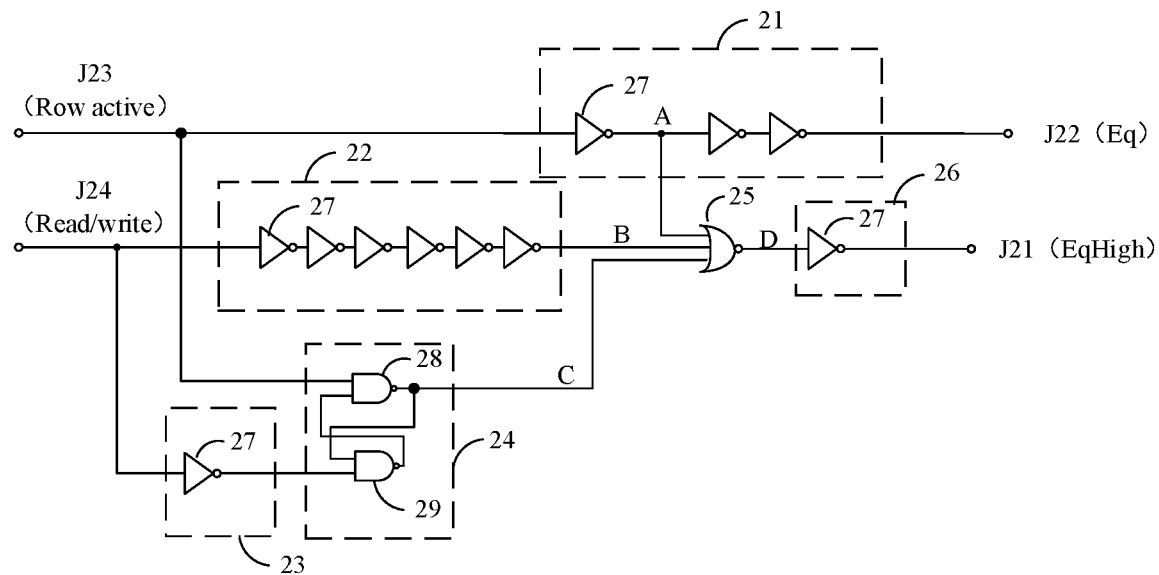
FIG. 3 is a circuit diagram of a control circuit according to an embodiment.

In some examples, please referring to FIG. 1 to FIG. 3, the control circuit 20 may include a first inverting unit 21, a time delay unit 22, a second inverting unit 23, a latch unit 24, a three input NOR gate 25 and a third inverting unit 26, and the latch unit 24 may include a first input end, a second input end and an output end.

The input end of the first inverting unit 21 is connected with the first input end of the latch unit 24 and serves as the first input end J23 of the control circuit 20, that is, a signal input at the input end of the first inverting unit 21 is a row active signal Row active; the first output end and the second output end (referring to the point A in FIG. 3) of the first inverting unit 21 are configured to output a signal obtained by inverting the row active signal Row active. The first output end of the first inverting unit 21 is the second output end J22 of the control circuit 20, so that the second control signal Eq output by the control circuit 20 to the control end of the second precharge unit 12 is the inverted signal of the row active signal Row active.

The first input end of the three input NOR gate 25 is connected with the second output end of the first inverting unit 21, and the signal input at the first input end of the three input NOR gate 25 is the inverted signal of the row activation signal Row active.

The input end of the time delay unit 22 is connected with the input end of the second inverting unit 23 and serves as the second input end J24 of the control circuit 20. The output end of the time delay unit 22 (referring to point B in FIG. 3) is connected with the second input end of the three input NOR gate 25, that is, the signal input at the second input end of the three input NOR gate 25 is the signal after the read/write signal Read/Write is delayed for a preset time; the time delay unit 22 is configured to output the read/write signal Read/Write after delaying the preset time; and the second inverting unit 23 is configured to output a signal obtained by inverting the read/write signal Read/Write.

The second input end of the latch unit 24 is connected with the output end of the second inverting unit 23, that is, the signal input at the first input end of the latch unit 24 is the row active signal Row active, the signal input at the second input end of the latch unit 24 is a signal obtained by inverting the read/write signal Read/Write, and the output end of the latch unit 24 (referring to point C in FIG. 3) is connected with the third input end of the three input NOR gate 25.

The input end of the third inverting unit 26 is connected with the output end of the three input NOR gate 25 (referring to point D in FIG. 3), and the output end of the third inverting unit 26 is used as the first output end J21 of the control circuit 20; the third inverting unit 26 is configured to invert the signal input at the input end and output the inverted signal, and the output end of the third inverting unit 26 is the first output end J21 of the control circuit 20.

Specifically, for a time period t1, the row active signal Row active input by the input end of the first inverting unit 21 is at a low level, the memory is not in a row active state, a second control signal Eq output by the first output end of the first inverting unit 21 is at a high level after inverting of the first inverting unit 21, the control end of the second precharge unit 12 controls the second power supply end J12 and the data end J15 to be connected after receiving the high level, and the second power supply end J12 inputs the second precharge voltage to the data end J15. The row active signal Row active input by the first input end of the latch unit 24 is at a low level, an output signal, namely the point C signal, is at a high level.

For a time period t2, the row active signal Row active input by the input end of the first inverting unit 21 is at a high level, the memory is in a row active state, the signal output by the second output end of the first inverting unit 21, namely, the point A signal is at a low level after inverting of the first inverting unit 21, namely, the signal input the first input end of the three input NOR gate 25 is at the low-level. The signals input by the input end of the time delay unit 22 and the input end of the second inverting unit 23 are read/write signals Read/Write, which are at low level, the memory does not perform read/write operation, and the signal input by the time delay unit 22 to the second input end of the three input NOR gate 25 is the signal after the read/write signal Read/Write is delayed for preset time, namely B point signal, and is still at low level. The row active signal Row active input at the first input end of the latch unit 24 is at a high level, a signal obtained by inverting the read/write signal Read/Write input at the second input end of the latch unit 24 is at a high level, and the signal output at the output end of the latch unit 24, i.e. the point C signal, maintains the previous state and is at a high level; and thus, the signal output from the output of the three input NOR gate 25, that is, the point D signal, is at a low level. After inverting of the third inverting unit 26, the output end of the third inverting unit 26 inputs a high level to the control end of the first precharge unit 11, so that the first precharge unit 11 controls the first power supply end J11 and the data end J15 to be disconnected, and the first power supply end J11 stops inputting first precharge voltage to the data end J15.

For the preset time t3 after the first read/write operation is started, the row active signal Row active input at the input end of the first inverting unit 21 is at a high level, and the memory is in the row active state. After inverting through the first inverting unit 21, the signal output at the second output end of the first inverting unit 21, namely the point A signal, is at a low level, that is, the signal input at the first input of the three input NOR gate 25 is at a low level; the read/write signal Read/Write input at the input of the time delay unit 22 and the input of the second inverting unit 23 is at a high level, and the memory performs read/write operation. The signal input by the time delay unit 22 to the second input end of the three input NOR gate 25 is a signal after the read/write signal Read/Write is delayed for the preset time t3, namely the point B signal, is still at a low level; the row active signal Row active input at the first input end of the latch unit 24 is at a high level, a signal obtained by inverting the read/write signal Read/Write input at the second input end of the latch unit 24 is at a low level, the signal output at the output end of the latch unit 24, namely the point C signal, jumps to low level; and thus, the signal output from the output of the three input NOR gate 25, namely the point D signal, is at a high level. After inverting of the third inverting unit 26, the output end of the third inverting unit 26 inputs a low level to the control end of the first precharge unit 11, so that the first precharge unit 11 controls the first power supply end J11 and the data end J15 to be disconnected, and the first power supply end J11 stops inputting first precharge voltage to the data end J15.

For a time period t4 after the preset time t3 after the first read/write operation is started till the first read/write operation is ended, the row active signal Row active input at the input end of the first inverting unit 21 is at a high level, and the memory is in the row active state. After inverting through the first inverting unit 21, the signal output at the second output end of the first inverting unit 21, namely the point A signal, is at a low level, that is, the signal input at the first input of the three input NOR gate 25 is at a low level; the read/write signal Read/Write input at the input of the time delay unit 22 and the input end of the second inverting unit 23 is at a high level, and the memory performs read/write operation. The signal input by the time delay unit 22 to the second input end of the three input NOR gate 25 is a signal after the read/write signal Read/Write is delayed for the preset time t3, namely the point B signal, is still at a high level; the row active signal Row active input at the first input end of the latch unit 24 is at a high level, a signal obtained by inverting the read/write signal Read/Write input at the second input end of the latch unit 24 is at a low level, the signal output at the output end of the latch unit 24, namely the point C signal, maintains constantly to be at a low level; and thus, the signal output from the output end of the three input NOR gate 25, namely the point D signal, is at a low level. After inverting of the third inverting unit 26, the output end of the third inverting unit 26 inputs a high level to the control end of the first precharge unit 11, so that the first precharge unit 11 controls the first power supply end J11 and the data end J15 to be disconnected, and the first power supply end J11 stops inputting first precharge voltage to the data end J15.

For the preset time t5 after the first read/write operation is completed, the row active signal Row active input at the input end of the first inverting unit 21 is at a high level, and the memory is in the row active state. After inverting through the first inverting unit 21, the signal output at the second output end of the first inverting unit 21, namely the point A signal, is at a low level, that is, the signal input at the first input of the three input NOR gate 25 is at a low level; the read/write signal Read/Write input at the input of the time delay unit 22 and the input of the second inverting unit 23 is at a low level, and the memory does not perform read/write operation. The signal input by the time delay unit 22 to the second input end of the three input NOR gate 25 is a signal after the read/write signal Read/Write is delayed for the preset time t5, namely the point B signal, is still at a high level; the row active signal Row active input at the first input end of the latch unit 24 is at a high level, a signal obtained by inverting the read/write signal Read/Write input at the second input end of the latch unit 24 is at a high level, the signal output at the output end of the latch unit 24, namely the point C signal, maintains constantly to be at a low level; and thus, the signal output from the output of the three input NOR gate 25, namely the point D signal, is at a low level. After inverting of the third inverting unit 26, the output end of the third inverting unit 26 inputs a high level to the control end of the first precharge unit 11, so that the first precharge unit 11 controls the first power supply end J11 and the data end J15 to be disconnected, and the first power supply end J11 still stops inputting first precharge voltage to the data end J15.

For a time period t6 after the preset time t5 after the first read/write operation is competed till the next read/write operation is started, the row active signal Row active input at the input end of the first inverting unit 21 is at a high level, and the memory is in the row active state. After inverting through the first inverting unit 21, the signal output at the second output end of the first inverting unit 21, namely the point A signal, is at a low level, that is, the signal input at the first input of the three input NOR gate 25 is at a low level; the read/write signal Read/Write input at the input of the time delay unit 22 and the input of the second inverting unit 23 is at a low level, and the memory does not perform read/write operation. The signal input by the time delay unit 22 to the second input end of the three input NOR gate 25 is a signal after the read/write signal Read/Write is delayed for the preset time t5, namely the point B signal, is still at a low level; the row active signal Row active input at the first input end of the latch unit 24 is at a high level, a signal obtained by inverting the read/write signal Read/Write input at the second input end of the latch unit 24 is at a high level, the signal output at the output end of the latch unit 24, namely the point C signal, maintains constantly to be at a low level; and thus, the signal output from the output of the three input NOR gate 25, namely the point D signal, is at a high level. After inverting of the third inverting unit 26, the output end of the third inverting unit 26 inputs a low level to the control end of the first precharge unit 11, so that the first precharge unit 11 controls the first power supply end J11 and the data end J15 to be disconnected, and the first power supply end J11 stops inputting first precharge voltage to the data end J15.

For the whole time period t7, the row active signal Row active input by the input end of the first inverting unit 21 is at a high level, the memory is in a row active state, a second control signal Eq output by the first output end of the first inverting unit 21 is at a low level after inverting of the first inverting unit 21, the control end of the second precharge unit 12 controls the second power supply end J12 and the data end J15 to be disconnected after receiving the low level, and the second power supply end J12 stops inputting the second precharge voltage to the data end J15.

In some examples, please referring to FIG. 3, the first inverting unit 21 may include N inverters 27 which are sequentially connected in series, the output end of the last inverter 27 in the first inverting unit 21 is the first output end of the first inverting unit 21, and the output end of the $N_x$th inverter 27 in the first inverting unit 21 is the second output end of the first inverting unit 21. N and $N_x$ are positive odd numbers, and $N_x$ is less than or equal to N. In the example of FIG. 3, N is equal to 3, and $N_x$ is equal to 1.

In some examples, please referring to FIG. 3, the time delay unit 22 may include M inverters 27 which are sequentially connected in series. M is a positive even number. In the example of FIG. 3, M is equal to 6. In other examples, the time delay unit 22 may adopt any other circuit structure known to those skilled in the art.

In some examples, referring to FIG. 3, the second inverting unit 23 includes Q inverters 27 which are sequentially connected in series. Q is a positive odd number. In the example of FIG. 3, Q is equal to 1.

In some examples, referring to FIG. 3, the third inverting unit 26 may include P inverters 27 which are sequentially connected in series. P is a positive odd number. In the example of FIG. 3, P is equal to 1.

It is to be noted that, N and $N_x$ in the first inverting unit 21, M in the time delay unit 22, Q in the second inverting unit 23, and P in the third inverting unit 26 are not limited in number to the example of FIG. 3.

In some examples, please referring to FIG. 3, the latch unit 24 may include a latch. In other examples, the latch unit 24 may adopt any other circuit structure known to those skilled in the art.

In some examples, please referring to FIG. 3, the latch unit 24 may include the following parts. A first NAND gate 28 and a second NAND gate 29 are included. The first input end of the first NAND gate 28 is used as the first input of the latch unit 24, the second input of the first NAND gate 28 is connected with the output of the second NAND gate 29, the output end of the first NAND gate 28 is connected with the third input end of the three input NOR gate 25 and the first input end of the second NAND gate 29 as the output end of the latch unit 24, and the second input of the second NAND gate 29 serves as the second input of the latch unit 24.

Figure 4:
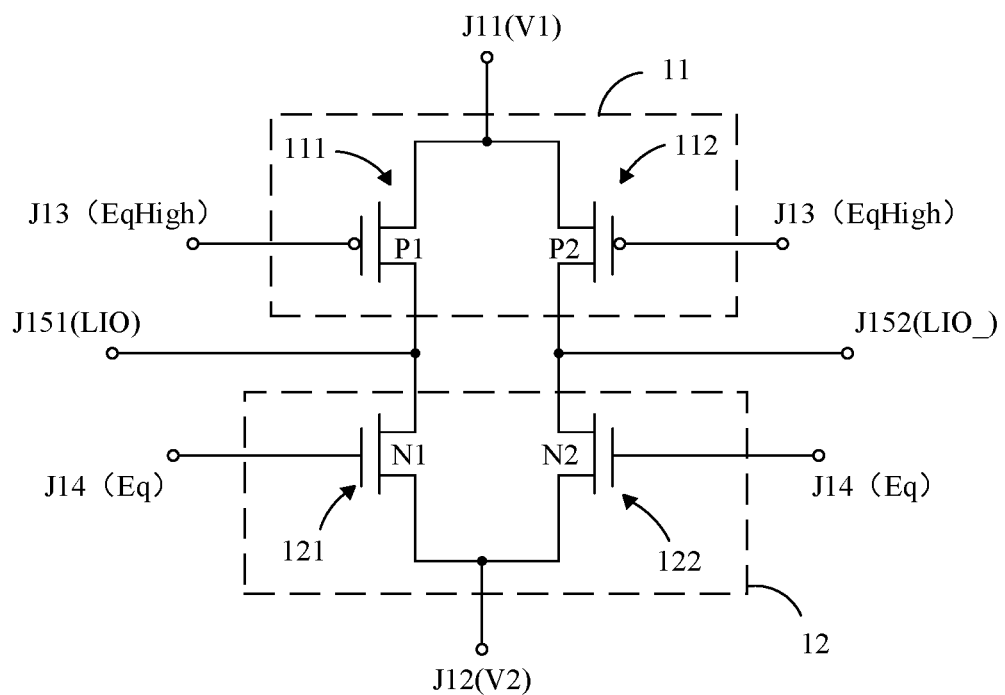
FIG. 4 is a circuit diagram of a precharge circuit according to an embodiment.

In some examples, please referring to FIG. 1 and FIG. 4, the data end J15 may include a first data end J151 and a second data end J152, the data signal received by the first data end J151 is opposite to the data signal received by the second data end J152. For example, the first data end J151 may be connected to a local data line to receive LIO signals; and the second data end J152 may be connected to a complementary local data line to receive LIO signals. The first precharge unit 11 includes a first switch unit 111 and a second switch unit 112. A first electrical connection end of the first switch unit 111 and a first electrical connection end of the second switch unit 112 are both connected to the first power supply end J11, and the first power supply end J11 inputs a first precharge voltage V1. The control end of the first switch unit 111 and the control end of the second switch unit 112 are both connected with the first control end J13 so as to obtain the first control signal EqHigh. A second electrical connection end of the first switch unit 111 is connected to the first data end J151, and a second electrical connection end of the second switch unit 112 is connected to the second data end J152.

In some examples, the switching characteristics of the first switch unit 111 and the second switch unit 112 may be the same, and the first control signal EqHigh output by the first output end J21 of the control circuit 20 controls the first electrical connection end and the second electrical connection end of the first switch unit 111 to be connected and controls a first electrical connection end and a second electrical connection end of the second switch unit 112 to be connected, so that the first power supply end J11 simultaneously inputs the first precharge voltage V1 to the first data end J151 and the second data end J152; or the first control signal EqHigh output by the first output end J21 of the control circuit 20 controls the first electrical connection end and the second electrical connection end of the first switch unit 111 to be disconnected and also controls the first electrical connection end and the second electrical connection end of the second switch unit 112 to be disconnected, therefore, the first power supply end J11 stops inputting the first precharge voltage V1 to the first data end J151 and the second data end J152 at the same time.

In some examples, the second precharge unit 12 includes a third switch unit 121 and a fourth switch unit 122. A first electrical connection end of the third switch unit 121 and a first electrical connection end of the fourth switch unit 122 are both connected to the second power supply end J12, and thus second precharge voltage V2 is input. A control end of the third switch unit 121 and a control end of the fourth switch unit 122 are both connected with the first control end J14 so as to obtain a second control signal Eq. A second electrical connection end of the third switch unit 121 is connected to the first data end J151, and a second electrical connection end of the fourth switch unit 122 is connected to the second data end J152.

In some embodiments, the switching characteristics of the third switch unit 121 and the fourth switch unit 122 may be the same, and the second control signal Eq output by the second output end J22 of the control circuit 20 controls the first electrical connection end and the second electrical connection end of the third switch unit 121 to be connected and controls a first electrical connection end and a second electrical connection end of the fourth switch unit 122 to be connected, so that the second power supply end J12 simultaneously inputs the second precharge voltage V2 to the first data end J151 and the second data end J152; or the second control signal Eq output by the second output end J22 of the control circuit 20 controls the first electrical connection end and the second electrical connection end of the third switch unit 121 to be disconnected and also controls the first electrical connection end and the second electrical connection end of the fourth switch unit 122 to be disconnected, Therefore, the second power supply end J12 stops inputting the second precharge voltage V2 to the first data end J151 and the second data end J152 at the same time.

In some examples, the first switch unit 111 and the second switch unit 112 each include a Positive-channel Metal Oxide Semiconductor (PMOS) transistor. The first electrical connection end of the first switch unit 111 and the first electrical connection end of the second switch unit 112 are both sources of the PMOS transistor, the second electrical connection end of the first switch unit 111 and the second electrical connection end of the second switch unit 112 are both drains of the PMOS transistor, and the control end of the first switch unit 111 and the control end of the second switch unit 112 are both gates of the PMOS transistor. For example, referring to FIG. 4, the first switch unit includes a PMOS transistor P1 and the second switch unit includes a PMOS transistor P2.

Specifically, when the first control signal EqHigh is at a high level, the source and the drain of the PMOS transistor P1 are disconnected, the source and the drain of the PMOS transistor P2 are disconnected, and the first power supply end J11 stops inputting the first precharge voltage V1 to the first data end J151 and the second data end J152; and when the first control signal EqHigh is at a low level, the source and the drain of the PMOS transistor P1 are connected, the source and the drain of the PMOS transistor P2 are connected, and the first power supply end J11 inputs the first precharge voltage V1 to the first data end J151 and the second data end J152.

In some examples, the third switch unit 121 and the fourth switch unit 122 each includes an N-Metal-Oxide-Semiconductor (NMOS) transistor, a first electrical connection end of the third switch unit 121 and a first electrical connection end of the fourth switch unit 122 are sources of the respective NMOS transistors, and a second electrical connection end of the third switch unit 121 and a second electrical connection end of the fourth switch unit 122 are drains of the respective NMOS transistors, and a control end of the third switch unit 121 and a control end of the fourth switch unit 122 are gates of the respective NMOS transistors. For example, referring to FIG. 4, the third switch unit includes a NMOS transistor N1 and the fourth switch unit includes a NMOS transistor N2.

Specifically, when the second control signal Eq is at a high level, the source and the drain of the NMOS transistor N1 are connected, the source and the drain of the NMOS transistor N2 are connected, and the second power supply end J12 inputs the second precharge voltage V2 to the first data end J151 and the second data end J152; and when the second control signal Eq is at a low level, the source and the drain of the NMOS transistor N1 are disconnected, the source and the drain of the NMOS transistor N2 are disconnected, and the second power supply end J12 stops inputting the second precharge voltage V2 to the first data end J151 and the second data end J152.

Figure 5:
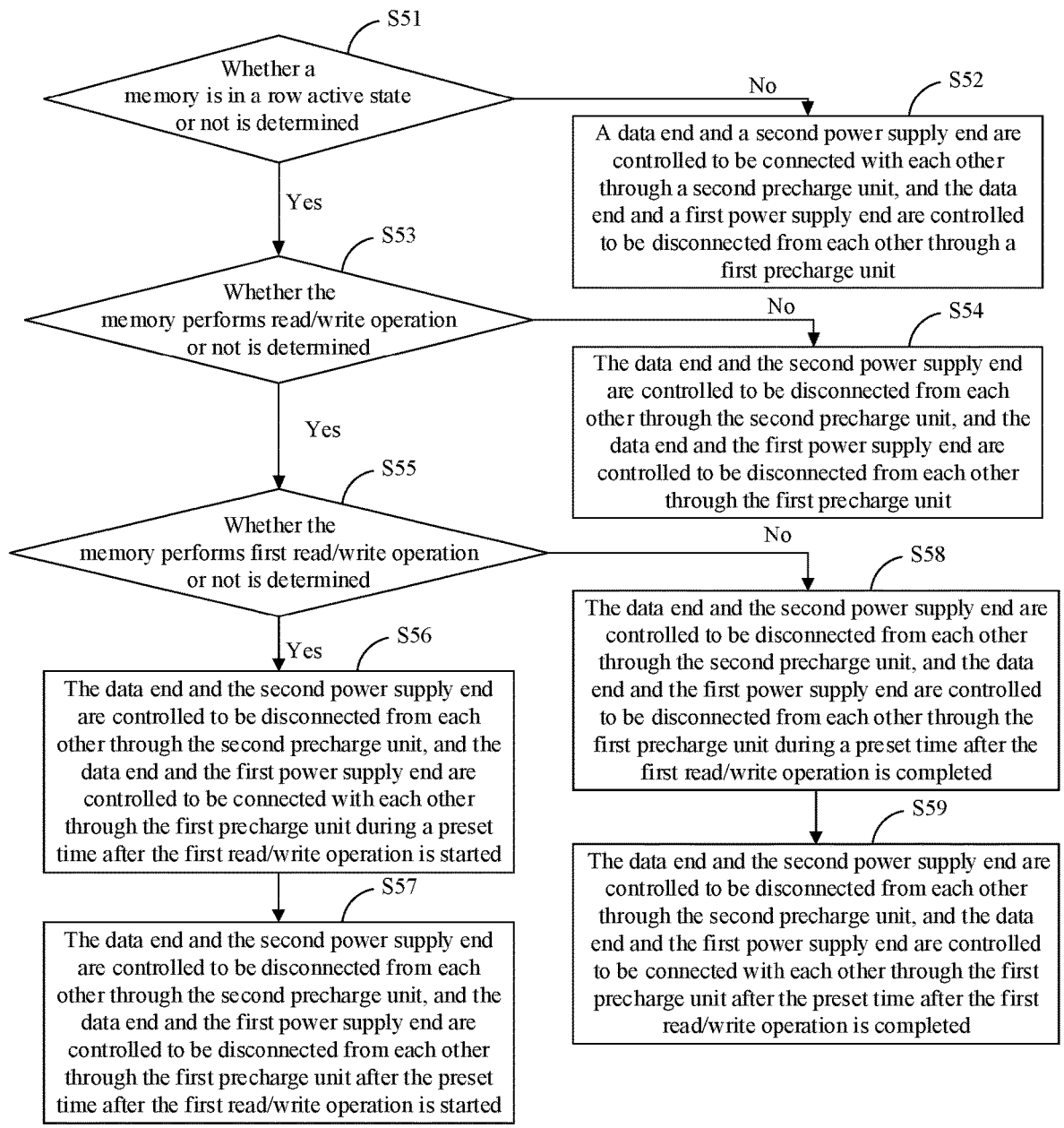
FIG. 5 is a flowchart of a method for controlling precharge of a memory according to an embodiment.

The disclosure further provides a method for controlling precharge of a memory. The method for controlling precharge of a memory is applied to a precharge circuit of the memory. Please continuously referring to FIG. 1, the precharge circuit may include a first precharge unit 11, a second precharge unit 12, a first power supply end J11, a second power supply end J12, a first control end J13, a second control end J14 and a data end J15; the first precharge unit 11 is connected with the first power supply end J11, the first control end J13 and the data end J15; the second precharge unit 12 is connected with the second power supply end J12, the second control end J14 and the data end J15; and a first precharge voltage is input into the first power supply end J11, and a second precharge voltage is input into the second power supply end J12. As shown in FIG. 5, the method for controlling precharge of a memory includes the following operations.

At S51, whether the memory is in a row active state or not is judged.

If so, S53 is performed; otherwise, S52 is performed.

At S52, the data end J15 and the second power supply end J12 are controlled to be connected with each other through the second precharge unit 12 and the data end J15 and the first power supply end J11 are controlled to be disconnected from each other through the first precharge unit 11.

At S53, whether the memory performs read/write operation or not is judged.

If so, S55 is performed; otherwise, S54 is performed.

At S54, the data end J15 and the second power supply end J12 are controlled to be disconnected from each other through the second precharge unit 12 and the data end J15 and the first power supply end J11 are controlled to be disconnected from each other through the first precharge unit 11.

At S55, whether the memory performs FIRST read/write operation or not is judged.

If so, S56 and S57 are performed in sequence; otherwise, S58 and S59 are performed in sequence.

At S56, for the preset time after the first read/write operation is started, the data end J15 and the second power supply end J12 are controlled to be disconnected from each other through the second precharge unit 12 and the data end J15 and the first power supply end J11 are controlled to be connected with each other through the first precharge unit 11.

At S57, after the preset time after the first read/write operation is started, the data end J15 and the second power supply end J12 are controlled to be disconnected from each other through the second precharge unit 12 and the data end J15 and the first power supply end J11 are controlled to be disconnected from each other through the first precharge unit 11.

At S58, for the preset time after the first read/write operation is completed, the data end J15 and the second power supply end J12 are controlled to be disconnected from each other through the second precharge unit 12 and the data end J15 and the first power supply end J11 are controlled to be disconnected from each other through the first precharge unit 11.

At S59, after the preset time after the first read/write operation is completed, the data end J15 and the second power supply end J12 are controlled to be disconnected from each other through the second precharge unit 12 and the data end J15 and the first power supply end J11 are controlled to be connected with each other through the first precharge unit 11.

According to the method for controlling precharge of a memory, the data end J15 and the second power supply end J12 are controlled to be disconnected from each other through the second precharge unit 12 and the data end J15 and the first power supply end J11 are controlled to be disconnected from each other through the first precharge unit 11 when the memory is in the row active state and does not perform read/write operation, at the moment, first precharge voltage is not input to the data end J15, second precharge voltage is not input to the data end J15, so that a data line is not precharged; when a command of a read/write operation comes, the data end J15 is pulled to the first precharge voltage, which can reduce power consumption without affecting the normal operation of the memory. Meanwhile, after the preset time after the first read/write operation is completed, the memory circuit inputs the first precharge voltage to the data line through the data end J15, so that the memory does not need to be precharged separately at a preset time in the subsequent read/write operation cycle, which improves the read/write speed of the memory.

It should be understood that: although various steps in the flowchart of FIG. 5 are sequentially displayed by following arrows, the steps are not sequentially executed necessarily in the order indicated by the arrows. Unless expressly stated in the description, there are no strict sequence restrictions on the execution of these steps, and these steps may be executed in other order. Moreover, at least part of steps in FIG. 5 may include a plurality of steps or a plurality of stages, these steps or stages are not executed necessarily at the same time, and may be executed at different times, and these steps or stages are not sequentially executed necessarily, and may be executed in turn or alternatively with other steps or at least part of steps or stages in other steps.

In some examples, the memory performs multiple read/write operations in one cycle of the row active state. In one cycle of the row active state of the memory, after a preset time after each read/write operation is completed each time, the control circuit 20 controls the data end J15 and the first power supply end J11 to be connected with each other through the first precharge unit 11; after the preset time after the next read/write operation is started, the first precharge unit 11 controls the data end J15 and the first power supply end J11 to be disconnected.

The above method for controlling precharge of a memory not only ensures that the data line is precharged to the power supply voltage before each data reading and writing to prepare for subsequent data reading and writing, but also avoids the waste of current when the memory is in the row active state and does not perform read/write operation.

The present disclosure further provides a computer device, including a memory and a processor. The memory stores a computer program. When the processor executes the computer program, the steps of the method for controlling precharge of a memory in any of the above embodiments are realized.

According to the memory circuit and the method for controlling precharge of a memory, the data end and the second power supply end are controlled to be disconnected from each other through the second precharge unit and the data end and the first power supply end are controlled to be disconnected from each other through the first precharge unit when the memory is in the row active state and does not perform read/write operation, at the moment, first precharge voltage is not input to the data end, second precharge voltage is not input to the data end, so that a data line is not precharged when the memory is in the row active state and does not perform read/write operation, and therefore, waste of active current when the memory is in the row active state and does not perform read/write operation is avoided. When a command of a read/write operation comes, the data end is pulled to the first precharge voltage, which can reduce power consumption without affecting the normal operation of the memory. Meanwhile, after the preset time after the first read/write operation is completed, the memory circuit inputs the first precharge voltage to the data line through the data end, so that the memory does not need to be precharged separately at a preset time in the subsequent read/write operation cycle, which improves the read/write speed of the memory.

Each technical feature of the above-mentioned embodiments may be combined freely. For simplicity of description, not all possible combinations of each technical solution in the above-mentioned embodiments are described. However, any combination of these technical features shall fall within the scope recorded in the specification without conflicting.

The above-mentioned embodiments only express some implementations of the present disclosure and are specifically described in detail and not thus understood as limits to the patent scope of the present disclosure. It is to be pointed out that those of ordinary skill in the art may further make a plurality of transformations and improvements without departing from the concept of the present disclosure and all of these fall within the scope of protection of the present disclosure. Therefore, the scope of patent protection of the present disclosure should be subject to the appended claims.

What is claimed is:

1. A memory circuit, comprising:
a precharge circuit, comprising a first precharge circuit, a second precharge circuit, a first power supply end, a second power supply end, a first control end, a second control end and a data end, the first precharge circuit being connected with the first power supply end, the first control end and the data end, the second precharge circuit being connected with the second power supply end, the second control end and the data end, a first precharge voltage being input into the first power supply end, and a second precharge voltage being input into the second power supply end; and
a control circuit having a first output end connected with the first control end, and a second output end connected with the second control end, wherein the control circuit is configured to:
perform control to make the data end and the second power supply end to be connected with each other through the second precharge circuit and perform control to make the data end and the first power supply end to be disconnected from each other through the first precharge circuit, when a memory is not in a row active state;
perform control to make the data end and the second power supply end to be disconnected from each other through the second precharge circuit and perform control to make the data end and the first power supply end to be disconnected from each other through the first precharge circuit, when the memory is in the row active state and does not perform read/write operation;
perform control to make the data end and the second power supply end to be disconnected from each other through the second precharge circuit and to make the data end and the first power supply end to be connected with each other through the first precharge circuit, when the memory is in the row active state and during a preset time after a first read/write operation is started;
perform control to make the data end and the second power supply end to be disconnected from each other through the second precharge circuit and to make the data end and the first power supply end to be disconnected from each other through the first precharge circuit, when the memory is in the row active state and after a preset time after the first read/write operation is started;
perform control to make the data end and the second power supply end to be disconnected from each other through the second precharge circuit and to make the data end and the first power supply end to be disconnected from each other through the first precharge circuit, when the memory is in the row active state and during a preset time after the first read/write operation is completed; and perform control to make the data end and the second power supply end to be disconnected from each other through the second precharge circuit and to make the data end and the first power supply end to be connected with each other through the first precharge circuit, when the memory is in the row active state and after a preset time after the first read/write operation is completed.

2. The memory circuit of claim 1, wherein the first precharge voltage is a power supply voltage of the memory, and the second precharge voltage is a half of the power supply voltage of the memory.

3. The memory circuit of claim 1, wherein the memory performs multiple read/write operations in one cycle of the row active state, in one cycle of the row active state of the memory, after a preset time after each read/write operation is completed, the control circuit performs control to make the data end and the first power supply end to be connected with each other through the first precharge circuit, and after a preset time after a next read/write operation is started, performs control to make the data end and the first power supply end to be disconnected from each other through the first precharge circuit.

4. The memory circuit of claim 1, wherein a row active signal is input to the first input end of the control circuit, and a read/write signal is input to the second input end of the control circuit; when the row active signal is at a low level, the memory is not in the row active state; when the row active signal is at a high level, the memory is in the row active state; when the read/write signal is at a low level, the memory does not perform the read/write operation; and when the read/write signal is at a high level, the memory performs the read/write operation.

5. The memory circuit of claim 4, wherein the control circuit comprises a first inverting circuit, a time delay circuit, a three input NOR gate, a second inverting circuit, a third inverting circuit and a latch circuit, the latch circuit comprises a first input end, a second input end and an output end, wherein an input end of the first inverting circuit is connected with the first input end of the latch circuit and serves as the first input end of the control circuit, both a first output end and a second output end of the first inverting circuit are configured to output a signal obtained by inverting the row active signal, and the first output end of the first inverting circuit is the second output end of the control circuit;

a first input end of the three input NOR gate is connected with the second output end of the first inverting circuit;

an input end of the time delay circuit is connected with an input end of the second inverting circuit and serves as the second input end of the control circuit, an output end of the time delay circuit is connected with a second input end of the three input NOR gate, the time delay circuit is configured to output a read/write signal after delaying for the preset time, and the second inverting circuit is configured to output a signal obtained by inverting the read/write signal;

the second input end of the latch circuit is connected with an output end of the second inverting circuit, and the output end of the latch circuit is connected with a third input end of the three input NOR gate; and an input end of the third inverting circuit is connected with an output end of the three input NOR gate, an output end of the third inverting circuit is used as the first output end of the control circuit; and the third inverting circuit is configured to invert a signal input at the input end and output the inverted signal.

6. The memory circuit of claim 5, wherein the first inverting circuit comprises N inverters which are sequentially connected in series, an output end of a last inverter in the first inverting circuit is the first output end of the first inverting circuit, and an output end of the $N_x$th inverter in the first inverting circuit is the second output end of the first inverting circuit;

wherein N and $N_x$ are positive odd numbers, and $N_x$ is less than or equal to N.

7. The memory circuit of claim 5, wherein the time delay circuit comprises M inverters which are sequentially connected in series;

wherein M is a positive even number.

8. The memory circuit of claim 5, wherein the second inverting circuit comprises Q inverters which are sequentially connected in series;

wherein Q is a positive odd number.

9. The memory circuit of claim 5, wherein the third inverting circuit comprises P inverters which are sequentially connected in series;

wherein P is a positive odd number.

10. The memory circuit of claim 5, wherein the latch circuit comprises a latch.

11. The memory circuit of claim 10, wherein the latch circuit comprises a first NAND gate and a second NAND gate, wherein a first input end of the first NAND gate is used as a first input of the latch circuit, a second input of the first NAND gate is connected with an output of the second NAND gate, and an output end of the first NAND gate is connected with the third input end of the three input NOR gate and a first input end of the second NAND gate as the output end of the latch circuit;

a second input end of the second NAND gate is used as the second input end of the latch circuit.

12. The memory circuit of claim 1, wherein the data end comprises a first data end and a second data end, a data signal received by the first data end is opposite to a data signal received by the second data end; the first precharge circuit comprises a first switch circuit and a second switch circuit, a first electrical connection end of the first switch circuit and a first electrical connection end of the second switch circuit are both connected to the first power supply end, a control end of the first switch circuit and a control end of the second switch circuit are both connected with the first control end, a second electrical connection end of the first switch circuit is connected with the first data end; a second electrical connection end of the second switch circuit is connected with the second data end; and the second precharge circuit comprises a third switch circuit and a fourth switch circuit, a first electrical connection end of the third switch circuit and a first electrical connection end of the fourth switch circuit are both connected to the second power supply end, a control end of the third switch circuit and a control end of the fourth switch circuit are both connected with the second control end, a second electrical connection end of the third switch circuit is connected with the first data end; and a second electrical connection end of the fourth switch circuit is connected with the second data end.

13. The memory circuit of claim 12, wherein each of the first switch circuit and the second switch circuit comprises a PMOS transistor, the first electrical connection end of the first switch circuit and the first electrical connection end of the second switch circuit are sources of the respective PMOS transistors, the second electrical connection end of the first switch circuit and the second electrical connection end of the second switch circuit are drains of the respective PMOS transistors, and the control end of the first switch circuit and the control end of the second switch circuit are gates of the respective PMOS transistors; and each of the third switch circuit and the fourth switch circuit comprises an NMOS transistor, the first electrical connection end of the third switch circuit and the first electrical connection end of the fourth switch circuit are sources of the respective NMOS transistors, the second electrical connection end of the third switch circuit and the second electrical connection end of the fourth switch circuit are drains of the respective NMOS transistors, and the control end of the third switch circuit and the control end of the fourth switch circuit are gates of the respective NMOS transistors.

14. A method for controlling precharge of a memory, applied to a precharge circuit of the memory, wherein the precharge circuit comprises a first precharge circuit, a second precharge circuit, a first power supply end, a second power supply end, a first control end, a second control end and a data end; the first precharge circuit is connected with the first power supply end, the first control end and the data end; the second precharge circuit is connected with the second power supply end, the second control end and the data end; a first precharge voltage is input into the first power supply end, and a second precharge voltage is input into the second power supply end; the method comprising:

performing control to make the data end and the second power supply end to be connected with each other through the second precharge circuit and to make the data end and the first power supply end to be disconnected from each other through the first precharge circuit, when the memory is not in a row active state;

performing control to make the data end and the second power supply end to be disconnected from each other through the second precharge circuit and performing control to make the data end and the first power supply end to be disconnected from each other through the first precharge circuit, when the memory is in the row active state and does not perform read/write operation;

performing control to make the data end and the second power supply end to be disconnected from each other through the second precharge circuit and to make the data end and the first power supply end to be connected with each other through the first precharge circuit, when the memory is in the row active state and during a preset time after the first read/write operation is started;

performing control to make the data end and the second power supply end to be disconnected from each other through the second precharge circuit and to make the data end and the first power supply end to be disconnected from each other through the first precharge circuit, when the memory is in the row active state and after a preset time after the first read/write operation is started;

performing control to make the data end and the second power supply end to be disconnected from each other through the second precharge circuit and to make the data end and the first power supply end to be disconnected from each other through the first precharge circuit, when the memory is in the row active state and during a preset time after the first read/write operation is completed; and performing control to make the data end and the second power supply end to be disconnected from each other through the second precharge circuit and to make the data end and the first power supply end to be connected with each other through the first precharge circuit, when the memory is in the row active state and after a preset time after the first read/write operation is completed.

15. The method for controlling precharge of the memory of claim 14, wherein the memory performs multiple read/write operations in one cycle of the row active state; in one cycle of the row active state of the memory, after a preset time after each read/write operation is completed, the control circuit performs control to make the data end and the first power supply end to be connected with each other through the first precharge circuit; and after a preset time after a next read/write operation is started, performs control to make the data end and the first power supply end to be disconnected from each other through the first precharge circuit.

16. A computer device comprising a processor and a memory for storing a computer program that when executed by the processor, implements steps of the method of claim 14.

17. A computer device comprising a processor and a memory for storing a computer program that when executed by the processor, implements steps of the method of claim 15.

* * * * *